United States Patent
Koh et al.

(10) Patent No.: US 8,535,986 B2
(45) Date of Patent: Sep. 17, 2013

(54) METHOD OF PACKAGING AN INTEGRATED CIRCUIT USING A LASER TO REMOVE MATERIAL FROM A PORTION OF A LEAD FRAME

(75) Inventors: Liang Kng Ian Koh, Singapore (SG); Richard Mangapul Sinaga, Singapore (SG)

(73) Assignee: Infineon Technologies AG, Munich (DE)

( * ) Notice: Subject to any disclaimer, the term of this patent is extended or adjusted under 35 U.S.C. 154(b) by 2168 days.

(21) Appl. No.: 10/542,042

(22) PCT Filed: Jan. 13, 2003

(86) PCT No.: PCT/SG03/00007
§ 371 (c)(1),
(2), (4) Date: Jul. 13, 2005

(87) PCT Pub. No.: WO2011/149422
PCT Pub. Date: Dec. 1, 2011

(65) Prior Publication Data
US 2012/0043650 A1 Feb. 23, 2012

(51) Int. Cl.
*H01L 21/60* (2006.01)

(52) U.S. Cl.
USPC ........... 438/123; 438/112; 438/124; 438/127; 438/611; 438/617; 257/E21.506; 257/E21.53

(58) Field of Classification Search
USPC .................. 438/411, 461, 611, 123
See application file for complete search history.

(56) References Cited

U.S. PATENT DOCUMENTS

| | | | |
|---|---|---|---|
| 5,454,905 A * | 10/1995 | Fogelson | 29/827 |
| 5,890,644 A | 4/1999 | Ball | |
| 6,189,762 B1 | 2/2001 | Ball | |
| 6,326,238 B1 | 12/2001 | Corisis | |
| 6,437,429 B1 * | 8/2002 | Su et al. | 257/666 |
| 7,381,588 B1 * | 6/2008 | Patel et al. | 438/109 |
| 2004/0053447 A1 * | 3/2004 | Foster et al. | 438/123 |
| 2004/0097016 A1 * | 5/2004 | Yee et al. | 438/124 |

FOREIGN PATENT DOCUMENTS

| | | |
|---|---|---|
| EP | 0 849 794 A1 | 6/1998 |
| JP | 02-224362 A | 9/1990 |
| JP | 02224362 | 9/1990 |
| JP | 05251605 A * | 9/1993 |

\* cited by examiner

*Primary Examiner* — Thanh Nguyen
(74) *Attorney, Agent, or Firm* — Slater & Matsil, L.L.P.

(57) ABSTRACT

An integrated circuit 15 is placed onto a lead frame 101 having lead fingers 109 of substantially constant thickness along their length. Wires are formed from the lead fingers 109 to corresponding electrical contacts the integrated circuit. Following the wire bonding process, the thickness of the tips of the lead fingers 109 is reduced by a laser process, to form tips of reduced thickness desirable for a subsequent moulding operation. Thus, at the time of the wire bonding the tips of the fingers 109 need not have a gap beneath them, so that more secure wire bonds to the lead fingers 109 can be formed.

20 Claims, 3 Drawing Sheets

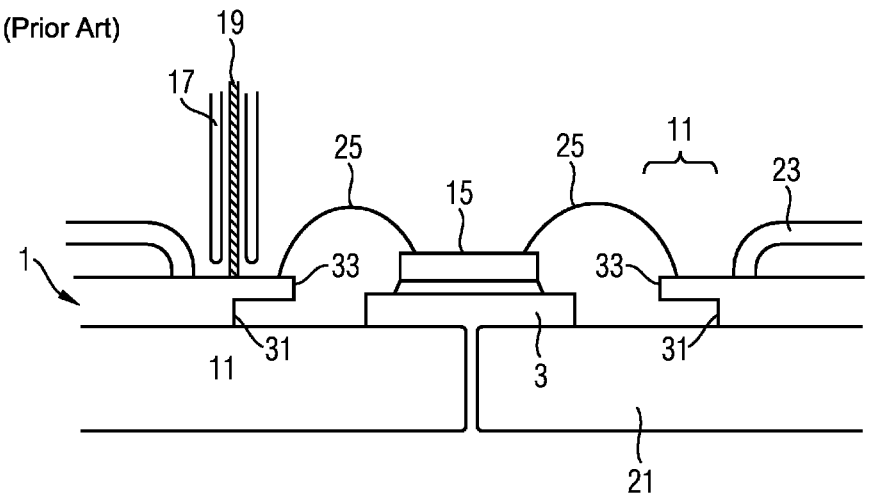
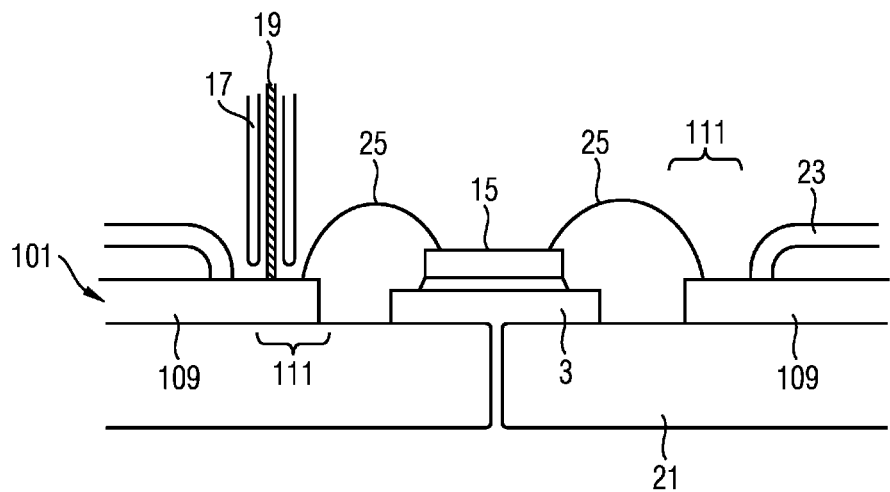

METHOD OF PACKAGING AN INTEGRATED CIRCUIT USING A LASER TO REMOVE MATERIAL FROM A PORTION OF A LEAD FRAME

FIELD OF THE INVENTION

The present invention relates to methods for packaging integrated circuits, and to integrated circuits formed in this way.

BACKGROUND OF INVENTION

It is well known to package integrated circuits (dies) by placing them on a die-pad area of a lead frame, forming wire connections between electrical contacts of the die and lead fingers of the frame, moulding a resin body around the integrated circuit and wires, and then cutting the lead-fingers to separate them from the lead frame.

There is continuing pressure to increase the number of inputs and outputs of the integrated circuit without increasing its size. One known lead frame 1 is shown in top view in FIG. 1, and a corner portion Z is shown in an expanded view in FIG. 2. The die pad 3 is connected to a support area 5 by elements 7. The lead frame 1 has lead fingers 9 which extend from the support area 5.

During the packaging process, the tip portions 11 of each of these fingers 9 are connected to one or more of the electrical contacts of the integrated circuit (not shown), the integrated circuit is encased in the resin body, and then the lead fingers 9 are cut at the dashed line 13. The tip portions 11 are spaced apart by a distance of only 0.15 mm in the plane of the lead frame.

The packaging process is now explained in more detail with reference to FIG. 3 which is a cross sectional schematic view (not to scale) of a die 15 during the wire bonding process. The die is adhered to the die pad 3. The lead frame 1 also rests on heat blocks 21, and is clamped there by a clamp member 23. The heat blocks 21 form the "paddle" of this clamp-and-paddle arrangement.

Note that the lead fingers 9 as formed of a layer 31, and the tip portion 11 is formed as an upper portion 33 of the layer 31 which projects beyond a lower portion of the layer 31. The manufacturing process of the lead frame includes a chemical etching process applied to the underside of the lead fingers 9 (as viewed in the orientation of FIG. 3) to reduce the thickness of the layer 31 below the portion 33.

A wire 19 located within a capillary tube 17 is ejected as required and bonded to electrical pads on the die 15 and to the tip portions 11 of respective lead fingers 9 by well known techniques, typically involving application of energy in the form of ultrasonic vibrations, to provide wires 25. The tip portions 11 may have a silver coating on at least their upper surface to improve the quality of the bonds.

Once the wire bonding is completed, the heat blocks 21 are removed, and the lead frame 1 is placed onto a horizontal surface in a mould (normally with a foil layer between the lead frame and the horizontal surface), where a resin body is moulded around the die 15 and the tips 11 of the lead fingers 9. After the resin body is formed, the fingers 9 are cut at the line 13 to singulate the integrated circuits and complete the packaging. The packaged integrated circuit may then be connected to other components, e.g. on a printed circuit board by soldering.

Note that due to the reduced thickness of the tip portions 11 of the lead frame, there is a space underneath the tip portions 11 during the moulding process. This means that the resin is able to flow underneath the tip portions 11, thereby holding them securely in place and ensuring that the tip portions of the lead fingers 9 are covered on their lower surface. This makes it much easier to use the packaged die because there is much less chance of two lead fingers 9 (which are typically separated from each other by only 0.15 mm) being electrically connected to each other when the packaged integrated circuit is soldered to a printed circuit board.

A known problem with the above system is that during the wire bonding process the thin tips 11 of the fingers 9 may vibrate in a vertical direction despite the clamp-and-paddle arrangement. This is known as the "springboard" or "cantilever" effect, and can result in poor wire bonds to the tip portions 11. This is a contributing factor in lengthening the set-up time of the assembly process, and increasing the yield loss in the assembly process.

Various techniques have been suggested to overcome this problems, but all concentrate on improved clamping of the tip portions 11 of the fingers 9, by extra clamps located on the tip portions from above or below. However, such techniques assume that the lead frame 1 is very accurately positioned. In practice this is not the case, so the success of the packaging process is not consistent.

SUMMARY OF THE INVENTION

The present invention aims to provide new and useful methods for packaging integrated circuits, and packaged integrated circuits produced by the methods.

In general terms, the invention proposes that following the wire bonding process the thickness of the tips of the lead fingers is reduced by a laser process. This means that at the time of the wire bonding the tips of the fingers need not have a gap beneath them, so that the springboard/cantilever effect is reduced.

BRIEF DESCRIPTION OF THE FIGURES

Preferred features of the invention will now be described, for the sake of illustration only, with reference to the following figures in which:

FIG. 3 is a cross-sectional view of the lead frame when a die is being wire bonded to it in a known process; and FIG. 4 is a cross-sectional view of the lead frame when a die is being wire bonded to it in a method according to the invention;

DETAILED DESCRIPTION OF THE EMBODIMENTS

Figure 1:
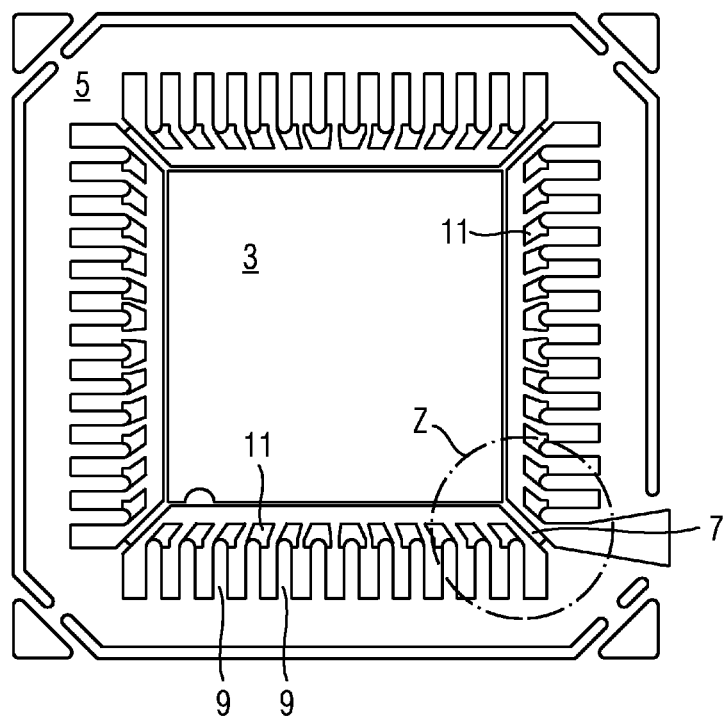
FIG. 1 is a view of a known lead frame.
Figure 2:
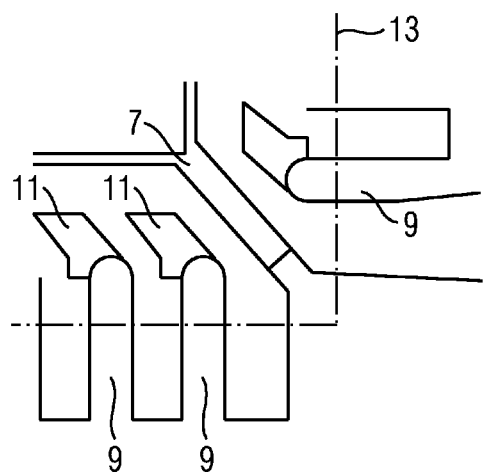
FIG. 2 is an enlarged view of a portion of the lead frame of FIG. 1.

Referring firstly to FIG. 4 the wire bonding step in a method which is an embodiment of the invention is shown. Items which are the same as those of FIG. 3 are given the same reference numerals. Items which are different are given reference numerals higher than 100.

In contrast to the lead frame 1 of FIG. 3, the tip portions 111 of the lead fingers 109 are in contact with the heat blocks 21, and may be thicker than the tip portions of the lead fingers 9 of FIG. 3 (i.e. in the vertical direction as shown in FIG. 4). Preferably, the lead fingers 109 are of substantially constant thickness along their length. This means that the wire bonding step can be performed without the springboard/cantilever effect.

Figure 5A:
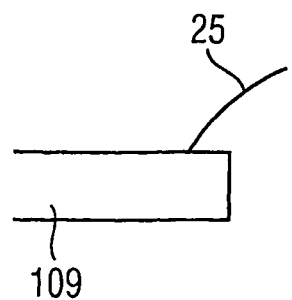
FIG. 5 shows a laser etching step following the wire bonding of FIG. 4.
Figure 5B:
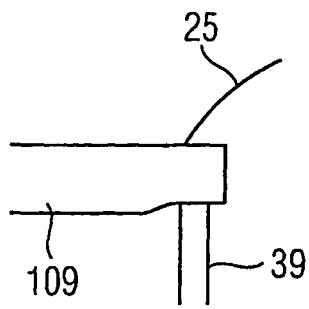
Figure 5C:
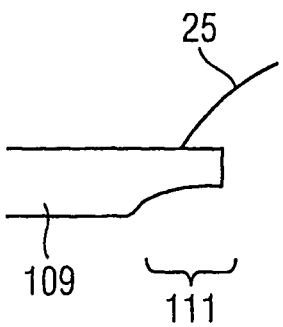

Following the wire bonding step of FIG. 4, a laser beam 39 is used to remove a lower tip portion of the lead fingers 109 (i.e. a portion on the surface of the lead fingers opposite the wire bonds), as shown in FIGS. 5(a)-(c), which respectively show the fingers 109 before, during and after the laser process. Typically, a thickness in the range 20 to 150 micrometers, such as about 50 micrometers or about 100 micrometers, is removed in this step. Note that it would be difficult to produce such a level of erosion at this stage by any other etching process (e.g. chemical etching) without risking damaging the integrated circuit or wires 25.

The present inventors have found that a Nd:YAG (Neodymium Doped, Yttrium Aluminium Garnet) laser (which produces a beam having a wavelength of 532 nm) is particularly suitable for generating the laser beam 39. Alternatively, a $CO_2$ laser may be used. The optimal wavelength of the laser may depend upon the material of the lead frame 101 (which is typically copper, or an alloy including copper).

The laser may be guided to laser only the correct portions 111 of the fingers 109 by an optical guidance system which measures the position of the lead frame optically. Preferably, the position of the lead frame 101 (e.g. the positions of the lead fingers 109) is measured optically constantly during the laser process, and this is used in a feedback-loop control of the laser. The observations may be performed by a TTL ("through the lens") mechanism, in which an image of the surface being laser etched is obtained through the lens which focuses the laser beam 39. In this way, the risk of causing damage to other portions of the assembly (e.g. the wires 25) is very much reduced.

Following the laser process of FIG. 5, the lead frame 101 (carrying the die) is inserted into a mould and moulded, for example as in conventional systems.

The present invention makes it possible to effect robust wire bonding since during the wire bonding step the fingers 109 can lie flatly on the paddle 21. Thus, without risk of vibration, the wire bonder can use ultrasonic energy at a temperature, time and bond force such that a stable wire bond is created. Ultrasonic energy will not be lost at the point of contact of the capillary tube 17 and the fingers 109, and furthermore the heat blocks 21 can be more effective since their connection with the tips 111 of the lead fingers 109 is improved.

Figure 6:
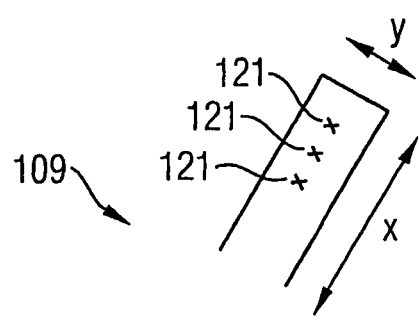
FIG. 6 shows the formation of multiple connections to a lead finger in the method of FIG. 4.

Furthermore, the present invention makes it easier to achieve a greater number of electrical contacts with a single lead frame. This is illustrated in FIG. 6, which shows a single lead finger 109. The width (marked as "y") of the finger 109 is determined by the application and should be as small as possible to maximise the number of lead fingers 109 which can be used. Thus, to maximise the number of locations 121 at which wire bonds can be placed, the length (marked as "x") of the fingers 109 should be as long as possible. In the conventional lead frame shown in FIG. 3, this would mean that the length of the tip portions 11 of the fingers 9 would have to be longer, thus increasing the undesirable springboard effect. By contrast, in the present invention the extension x can be made as long as desired without the vibrations in the height direction (i.e. into the page in FIG. 6) becoming significant, since the fingers 109 can have any desired thickness at the time of the wire bonding, and lead frame material can be removed from at least length x of the underside of the finger 109 subsequently, thus generating a narrowed tip portion 111 of length at least x.

Note that there are several possible advantages in providing multiple wire connections between a single one of the lead fingers 109 and the electrical contacts of the die 13.

For example, it can be useful if multiple different areas on the integrated circuit 15 which perform independent logical functions are connected to common lead fingers, e.g. if those lead fingers are associated with the power supply to the integrated circuit (e.g. if they are the $V_{ss}$ or $V_d$ connections).

In a further example, multiple wire bonds may be formed between a given lead finger 109 and the same contact on an integrated circuit 15, so that the various wire bonds share the task of electrically connecting that finger and contact. For example, this may be useful for reducing the inductance of the connection, or in the case that the wire bond between that lead finger and electrical contact is to carry a comparatively greater current so that a greater total cross sectional area of wire is desired to reduce overheating.

Although only a single embodiment of the invention has been described above, many modifications are possible within the scope of the invention as will be clear to a skilled reader.

The invention claimed is:

1. A method of packaging an integrated circuit, the method comprising:
   a) forming wire bonds on lead fingers of a lead frame to connect electrical contacts of the integrated circuit and corresponding lead fingers of the lead frame;
   b) after performing step a), using a laser to thin a portion of the lead fingers by removing material from a surface of the lead fingers opposite the wire bonds;
   c) after performing step b), forming a resin body encapsulating the integrated circuit and at least the thinned portion of the lead fingers; and
   d) after performing step c), severing the lead fingers at a location spaced from the thinned portion.

2. The method according to claim 1 wherein step b) comprises using the laser to remove a thickness of at least 50 micrometers from the surface of the lead fingers opposite the wire bonds.

3. The method according to claim 1 wherein step b) comprises using a Nd: YAG laser to thin the portion of the lead fingers.

4. The method according to claim 1 wherein step b) comprises using a $CO_2$ laser to thin the portion of the lead fingers.

5. The method according to claim 1 wherein step a) comprises forming a plurality of wire bonds to at least one of the lead fingers.

6. The method according to claim 5 wherein the plurality of wire bonds form wire connections between at least one given lead finger and different respective electrical contacts of the integrated circuit.

7. The method according to claim 5 wherein the plurality of wire bonds form multiple wire connections between at least one given lead finger and one electrical contact of the integrated circuit.

8. A method of packaging an integrated circuit, the method comprising:
   a) connecting wires between electrical contacts of the integrated circuit and corresponding lead fingers of a lead frame;
   b) after performing step a), using a laser to thin a portion of the lead fingers by removing material from a surface of the lead fingers directly opposite the connected wires; and
   c) after performing step b), encapsulating the integrated circuit and at least the thinned portion of the lead fingers.

9. The method according to claim 8, wherein step c) comprises forming a resin body encapsulating the integrated circuit and at least the thinned portion of the lead fingers.

10. The method according to claim 8, further comprising:
    d) after performing step c), severing the lead fingers at a location spaced from the thinned portion.

11. The method according to claim 8, wherein:
    step a) comprises connecting wires between electrical contacts of the integrated circuit and corresponding tip portions of the lead fingers, the tip portions having a first thickness; and
    step b) comprises using the laser to thin a tip portion such that the tip portion has a second thickness less than the first thickness.

12. The method according to claim 11, wherein other portions of the lead fingers have a thickness substantially equal to the first thickness.

13. The method according to claim 11 wherein step b) comprises using the laser to thin the tip portion on a surface opposite a surface on which the wires are connected to the tip portions.

14. The method according to claim 11, wherein step a) comprises connecting wires at least in part by forming wire bonds on the tip portions.

15. The method according to claim 9, wherein step a) comprises connecting wires at least in part by forming wire bonds on the lead fingers.

16. The method according to claim 8 wherein step b) further comprises optically measuring positions of the lead fingers when using the laser to thin the portion of the lead fingers.

17. A method of packaging an integrated circuit, the method comprising:
    locating an integrated circuit adjacent a lead frame, the lead frame including lead fingers having a substantially constant thickness;
    electrically connecting the integrated circuit to the lead frame by forming bond wires between the lead fingers of the lead frame and electrical contacts of the integrated circuit;
    after forming the bond wires, using a laser to reduce the thickness of a portion of the lead fingers such that the portion of the lead fingers with the reduced thickness has a thickness less than the substantially constant thickness; and
    after using the laser, encapsulating the integrated circuit and at least the portion of the lead fingers with the reduced thickness.

18. The method according to claim 17, wherein the encapsulating step comprises forming a resin body encapsulating the integrated circuit and at least the portion of the lead fingers with the reduced thickness.

19. The method according to claim 17, wherein using the laser to reduce the thickness comprises performing optical measurements when using the laser.

20. The method according to claim 17, wherein using the laser comprises using the laser to reduce the thickness of a portion of one of the lead fingers directly beneath one of the bond wires.

* * * * *